(12) United States Patent
Ohsawa et al.

(10) Patent No.: US 8,716,034 B2
(45) Date of Patent: May 6, 2014

(54) METHOD OF MANUFACTURING MAGNETIC MEMORY

(75) Inventors: Yuichi Ohsawa, Yokohama (JP); Shigeki Takahashi, Yokohama (JP); Junichi Ito, Yokohama (JP); Daisuke Saida, Fuchu (JP); Kyoichi Suguro, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 13/226,868

(22) Filed: Sep. 7, 2011

(65) Prior Publication Data

US 2012/0244639 A1    Sep. 27, 2012

(30) Foreign Application Priority Data

Mar. 22, 2011  (JP) ................. 2011-063286

(51) Int. Cl.
*H01L 21/00*    (2006.01)
(52) U.S. Cl.
USPC ........................ 438/3; 257/E21.211
(58) Field of Classification Search
USPC ............................................. 438/3
See application file for complete search history.

(56) References Cited

U.S. PATENT DOCUMENTS

| 6,483,675 | B1 | 11/2002 | Araki et al. | |
| 7,916,430 | B2* | 3/2011 | Kagami et al. | 360/319 |
| 2006/0105570 | A1* | 5/2006 | Hautala et al. | 438/687 |

FOREIGN PATENT DOCUMENTS

| JP | 2001-52316 A | 2/2001 |
| JP | 2002-176211 A | 6/2002 |
| JP | 2002-299726 A | 10/2002 |
| JP | 2002-305290 A | 10/2002 |
| JP | 2004-6589 A | 1/2004 |
| JP | 2004-500483 A | 1/2004 |
| JP | 2007-234897 A | 9/2007 |
| JP | 2010-3342 A | 1/2010 |
| JP | 2010-113782 A | 5/2010 |
| JP | 2011-40580 A | 2/2011 |

OTHER PUBLICATIONS

U.S. Appl. No. 13/621,978, filed Sep. 18, 2012, Ohsawa, et al.
F. J. Albert et al. "Spin-Polarized Current Switching of a Co Thin Film Nanomagnet", Applied Physics Letters, vol. 77, No. 23, Dec. 4, 2000, pp. 3809-3811.
Y. Otani et al. "Microfabrication of Magnetic Tunnel Junctions Using $CH_3$ OH Etching", IEEE Transactions on Magnetics, vol. 43, No. 6, Jun. 2007, pp. 2776-2778.
Japanese Office Action Issued Feb. 5, 2013 in Patent Application No. 2011-063286 (with English translation).
U.S. Appl. No. 13/231,894, filed Sep. 13, 2011, Takahashi, et al.
Office Action issued Aug. 27, 2013 in Japanese Patent Application No. 2011-063286 with English language translation.

* cited by examiner

*Primary Examiner* — Reema Patel
(74) *Attorney, Agent, or Firm* — Oblon, Spivak, McClelland, Maier & Neustadt, L.L.P.

(57) ABSTRACT

According to one embodiment, a method of manufacturing a magnetic memory, the method includes forming a first magnetic layer having a variable magnetization, forming a tunnel barrier layer on the first magnetic layer, forming a second magnetic layer on the tunnel barrier layer, the second magnetic layer having an invariable magnetization, forming a hard mask layer as a mask on the second magnetic layer, patterning the second magnetic layer by using the mask of the hard mask layer, and executing a GCIB-irradiation by using the mask of the hard mask layer, after the patterning.

26 Claims, 15 Drawing Sheets

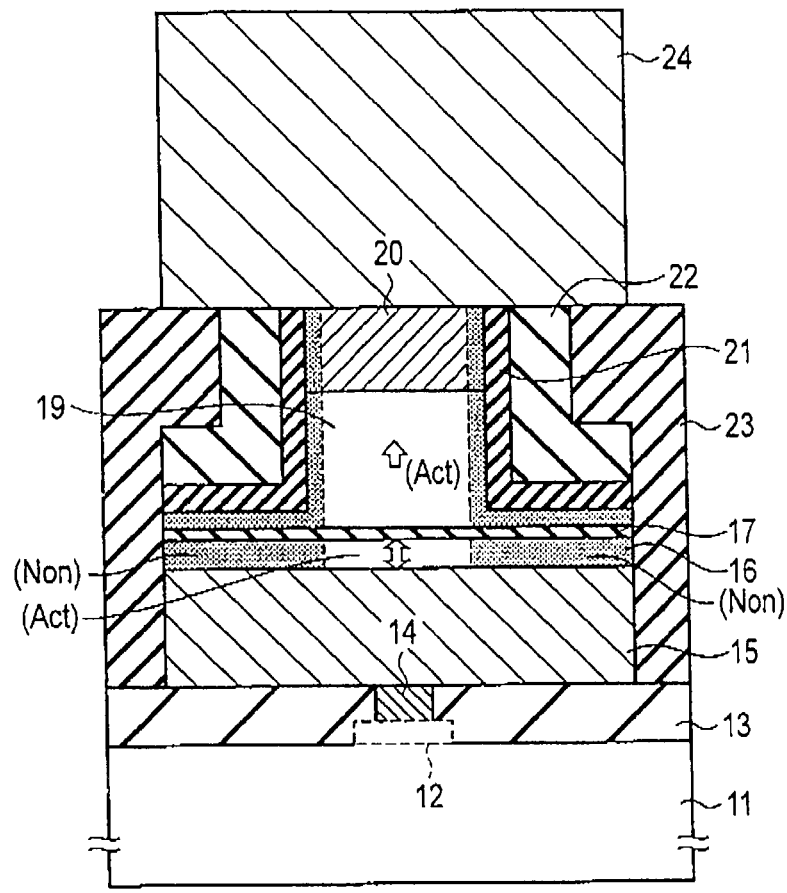
F I G. 1
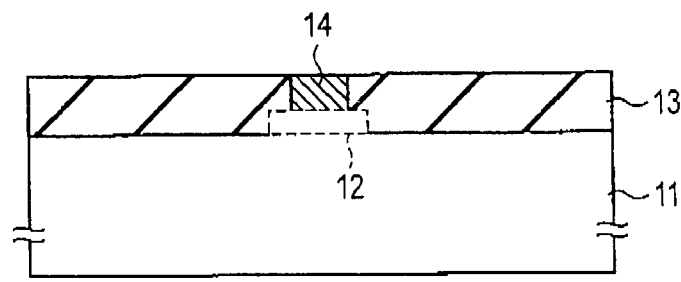
F I G. 2A

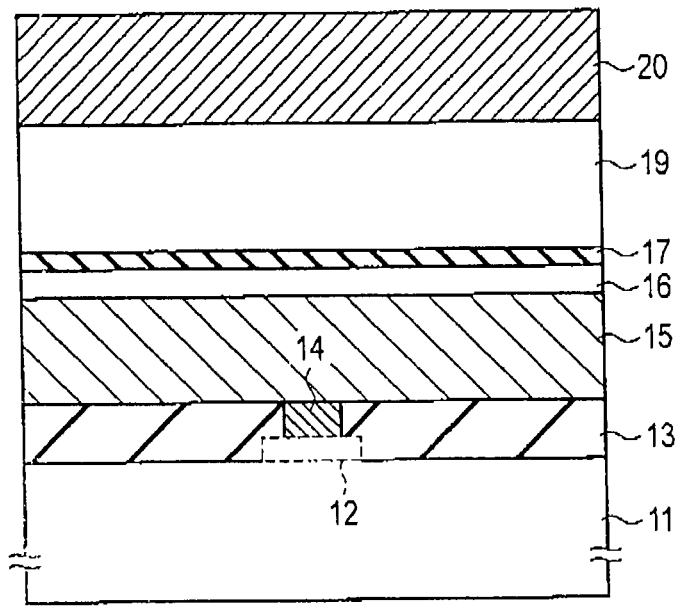
F I G. 2B
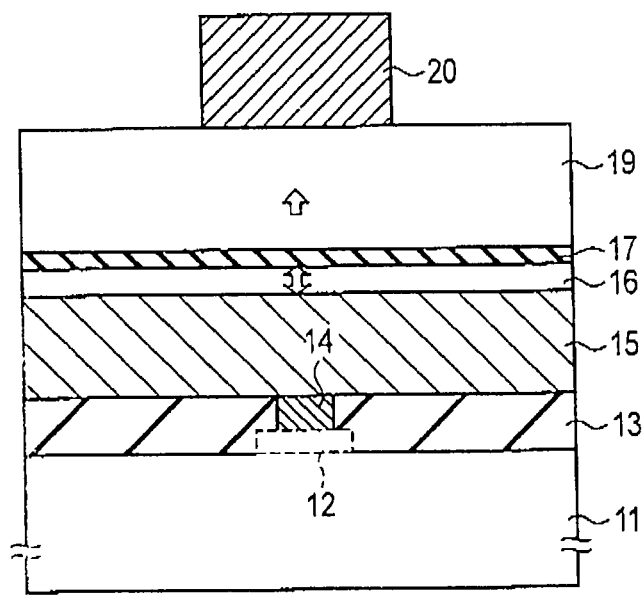
F I G. 2C

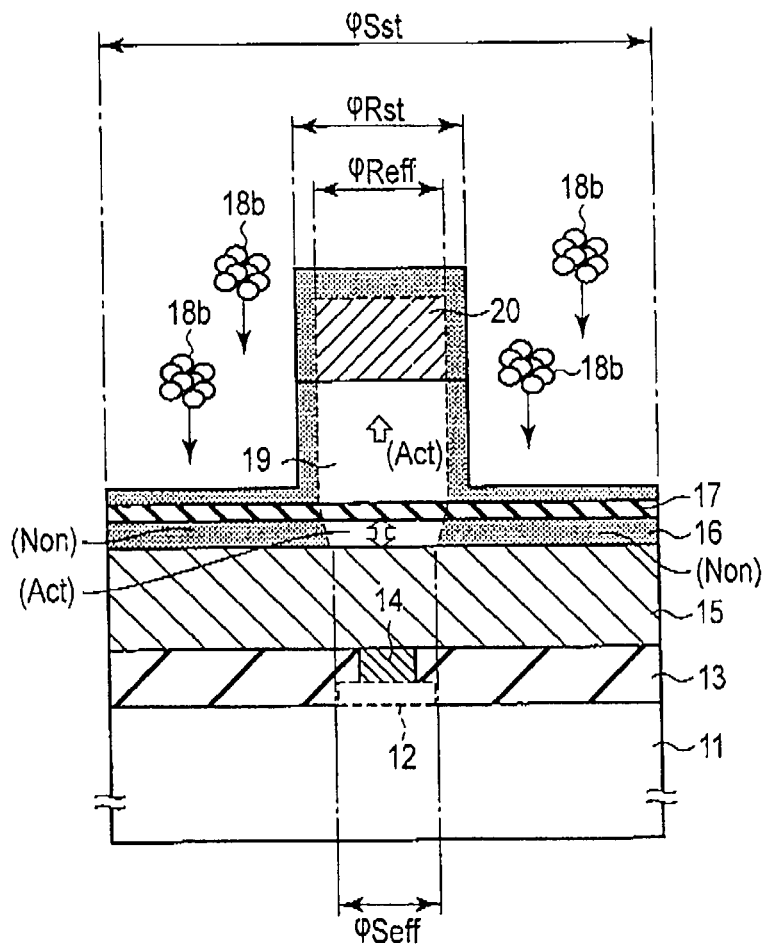
F I G. 2F

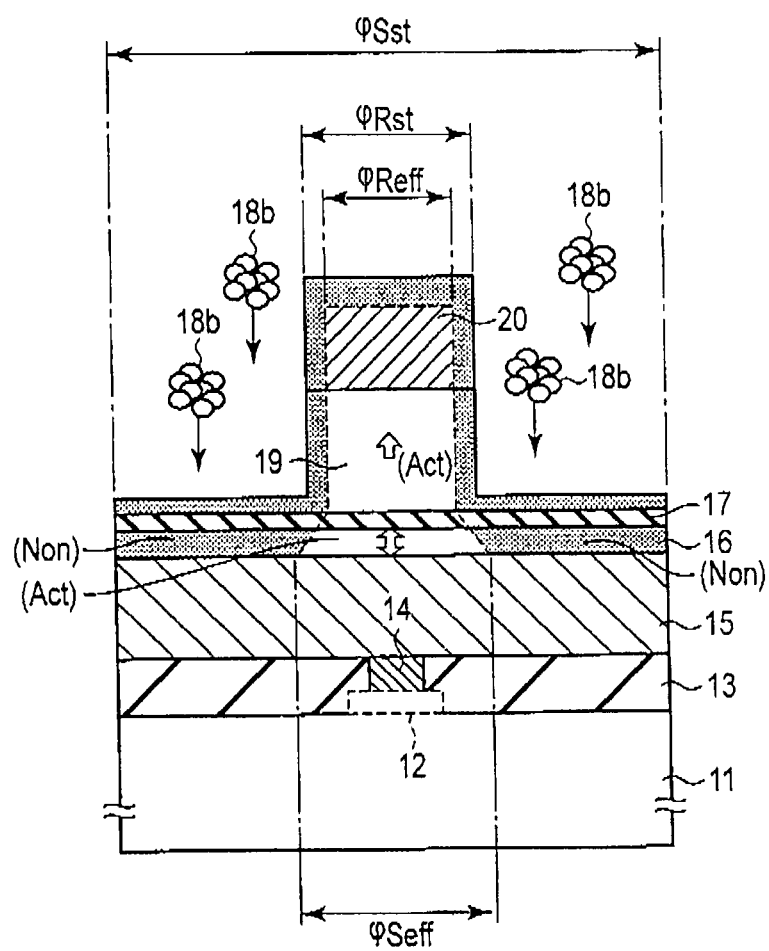
F I G. 2G

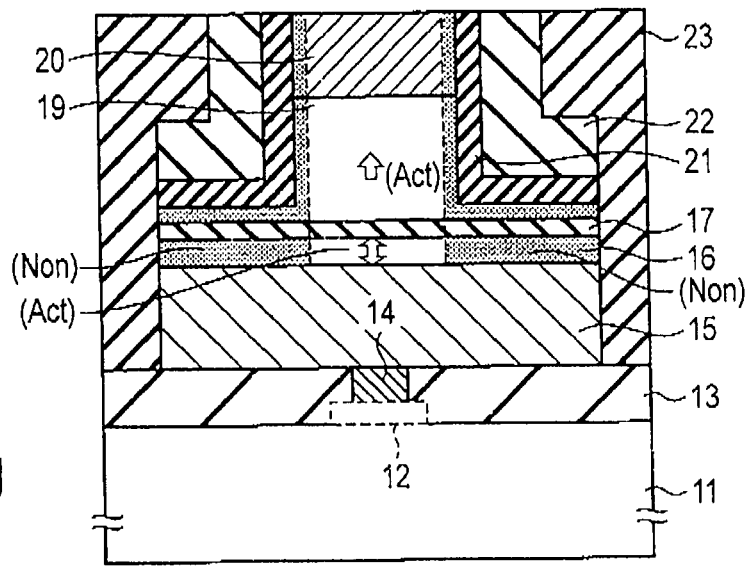
F I G. 2J
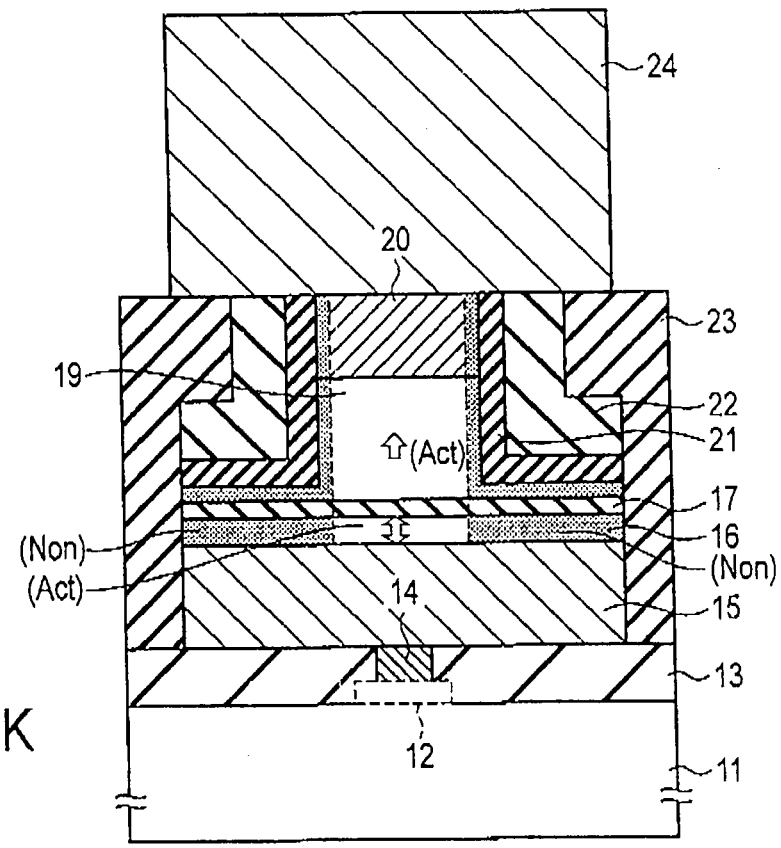
F I G. 2K

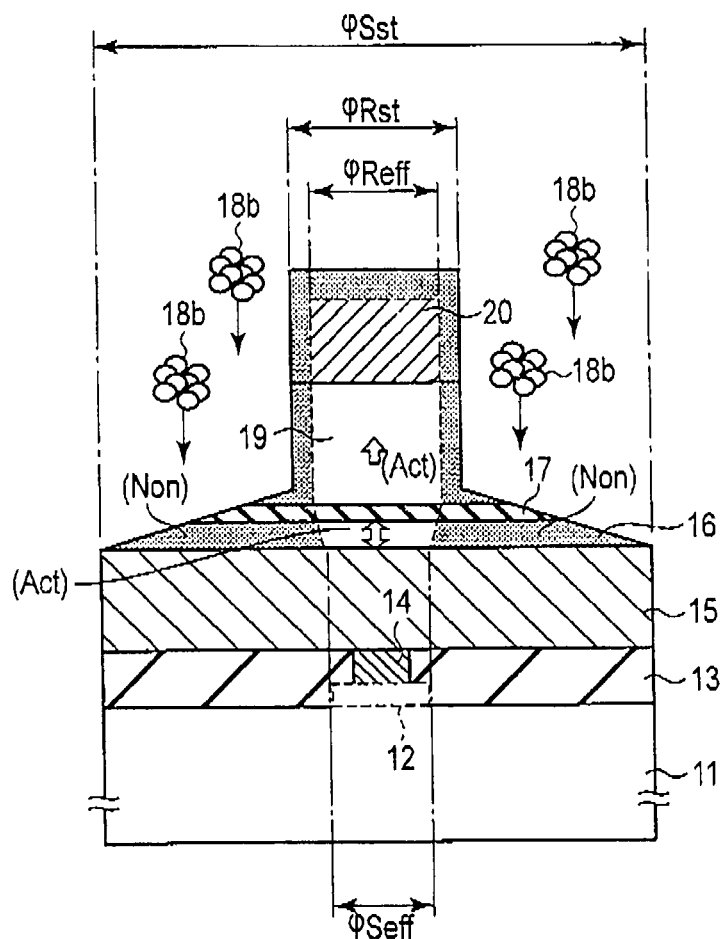
F I G. 3C

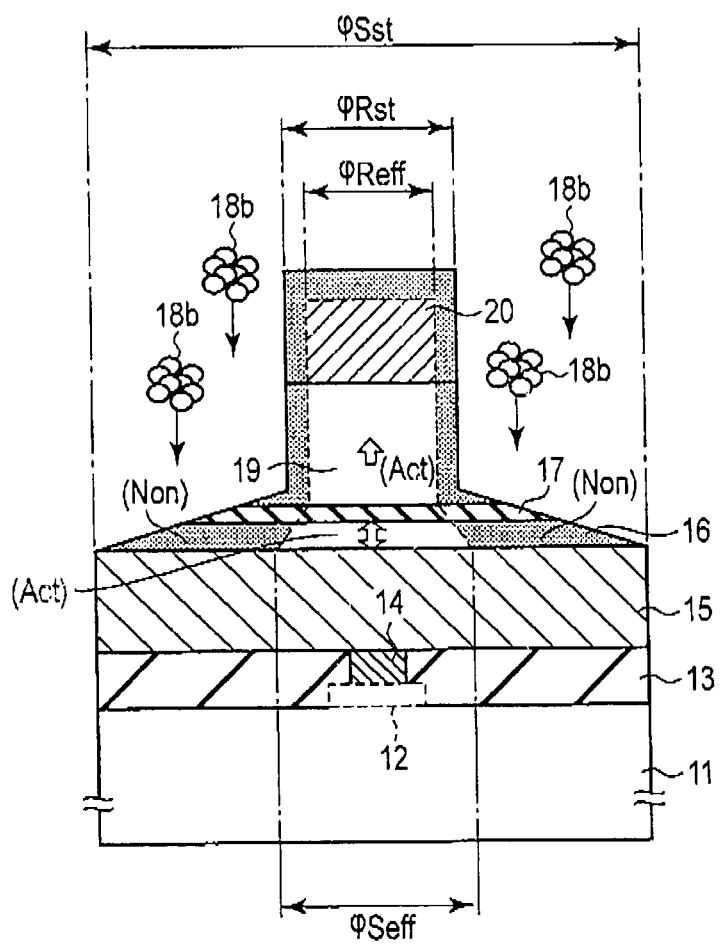
F I G. 3D

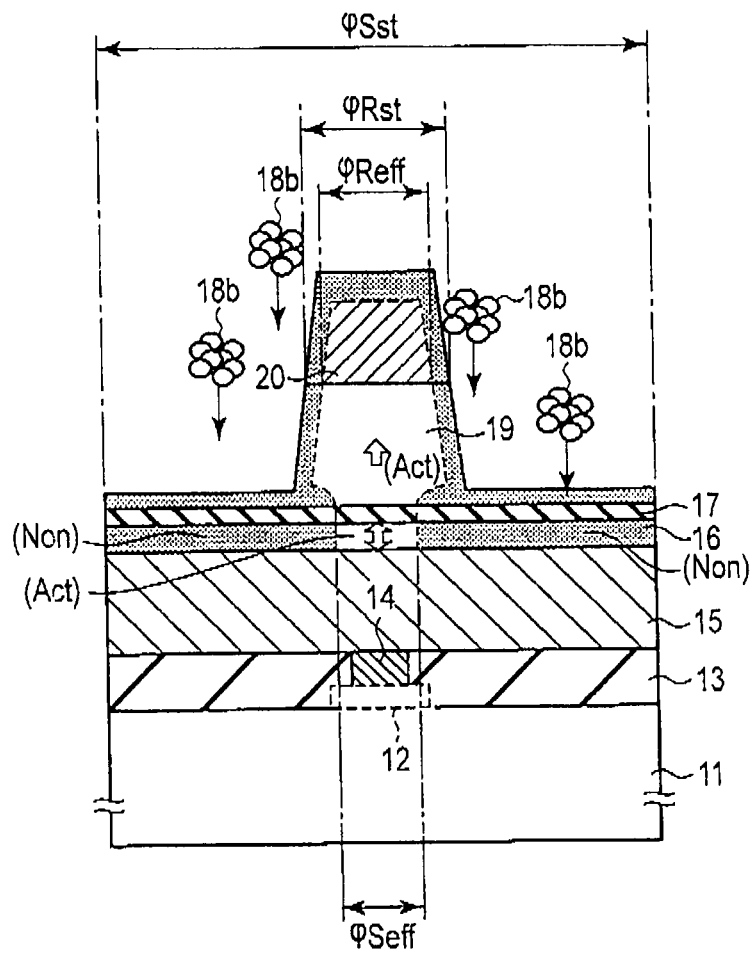
F I G. 4A

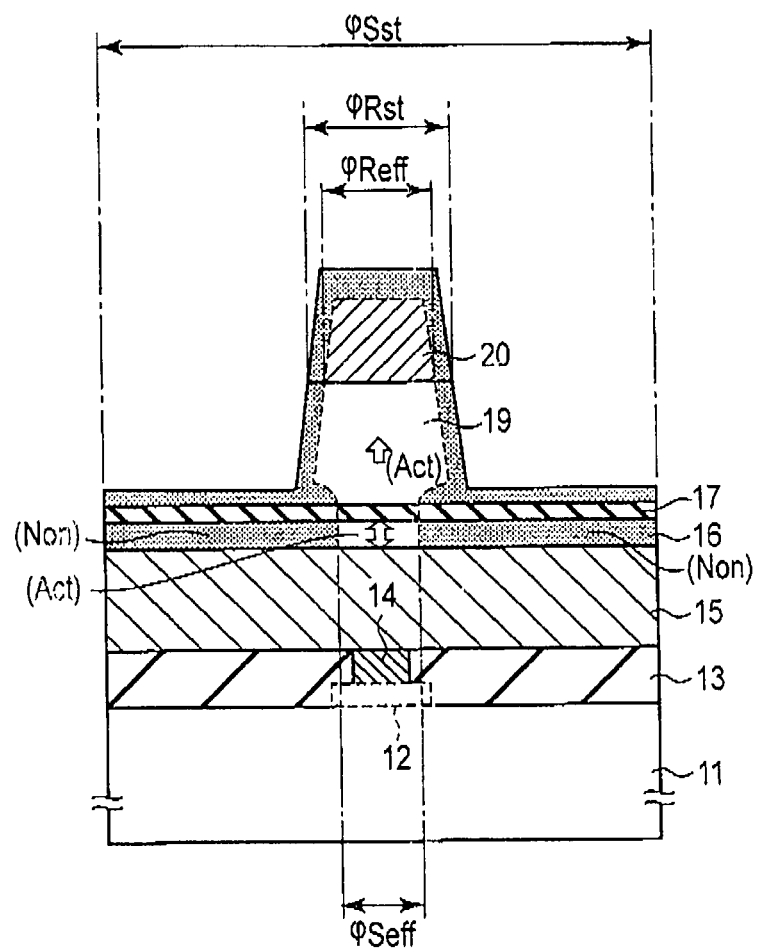
F I G. 4B

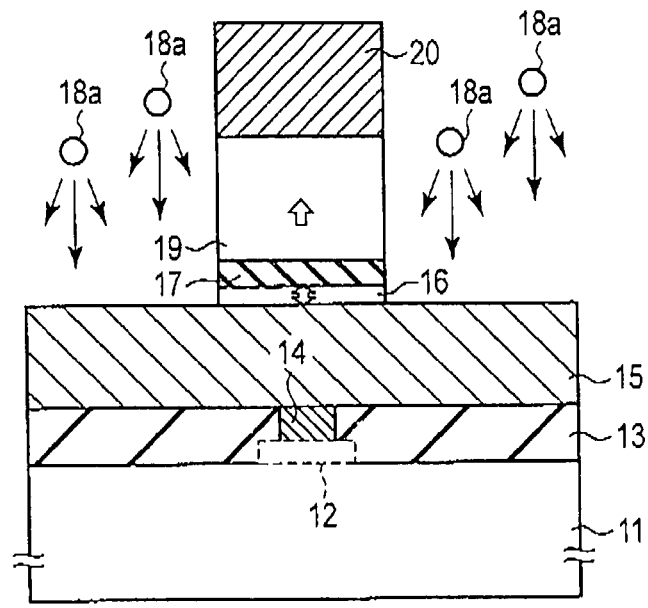
F I G. 5A
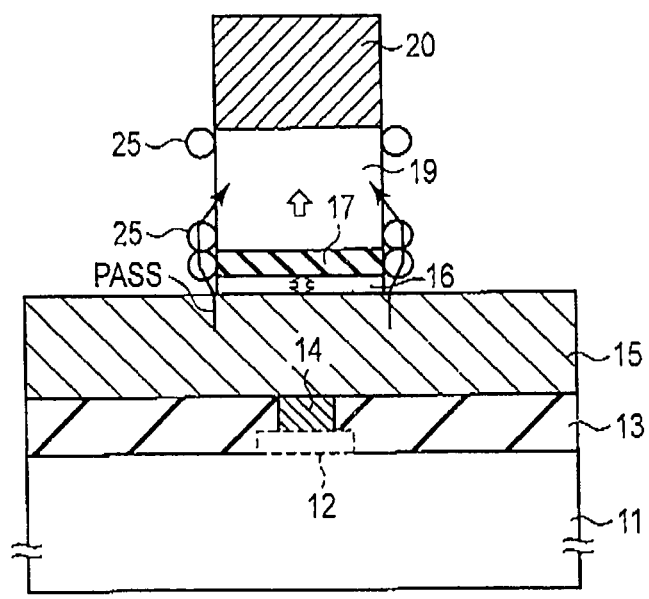
F I G. 5B

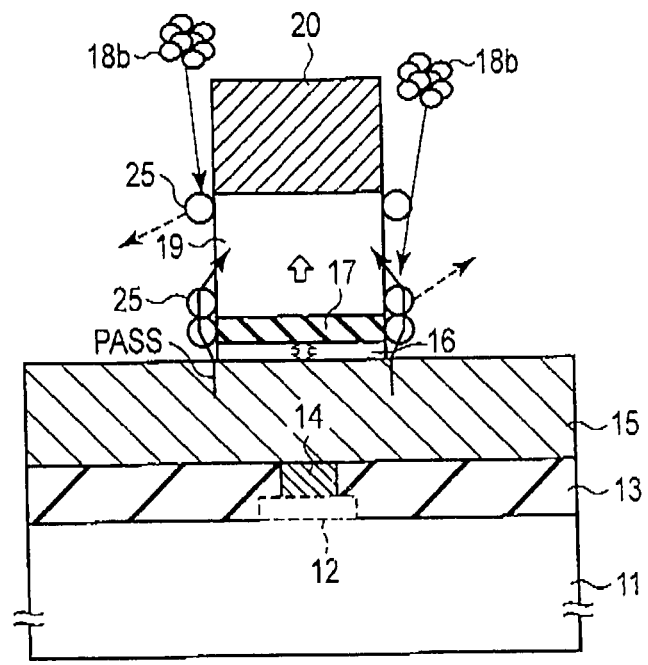
F I G. 5C
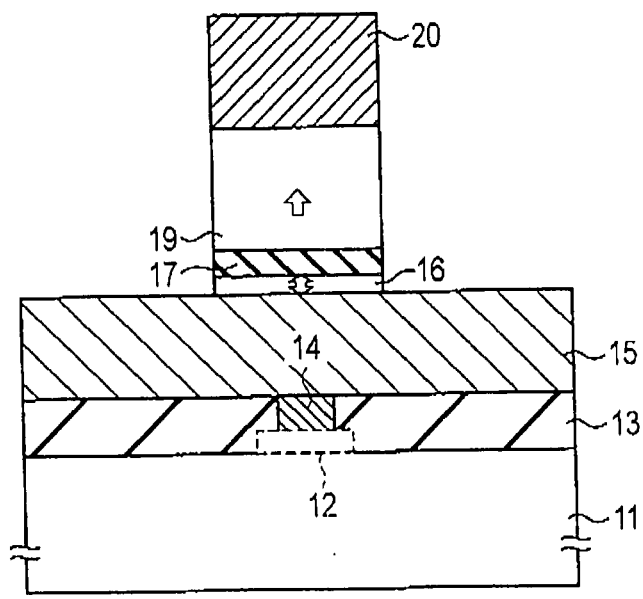
F I G. 5D

METHOD OF MANUFACTURING MAGNETIC MEMORY

CROSS-REFERENCE TO RELATED APPLICATIONS

This application is based upon and claims the benefit of priority from prior Japanese Patent Application No. 2011-063286, filed Mar. 22, 2011, the entire contents of which are incorporated herein by reference.

FIELD

Embodiments described herein relate generally to a method of manufacturing a magnetic memory.

BACKGROUND

In the past, applying a magnetic field has been known as a method for controlling a magnetization of a magnetic material. For example, in a hard disk drive (HDD), a magnetization of a medium is reversed by a magnetic field generated by a magnetic head to execute a write-in. In a conventional magnetic random access memory (MRAM), a magnetization of a cell is controlled by applying to a cell a current-induced magnetic field generated by causing a current to flow in lines provided near a magnetoresistive element. The current-induced magnetic field writing method for controlling a magnetization with external magnetic fields as explained above has a long history, and thus is the established technology.

On the other hand, along with the recent progress in nanotechnology, magnetic materials can be made into significantly finer sizes. Accordingly, magnetization control has to be done locally on a nanoscale. However, localizing a magnetic field is difficult because a magnetic field fundamentally spreads spatially. This causes a significant crosstalk problem. Even when a particular storage unit region (bit) or a memory cell is selected to control its magnetization, a magnetic field spreads to adjacent bits or memory cells due to the finer sizes of the bits and memory cells. On the other hand, if a magnetic field generation source is made small to localize a magnetic field, there is a problem in that sufficient magnetic fields cannot be generated to control the magnetization.

As a technique for solving these problems, the "spin injection-induced magnetization reversing method" is known, in which a current is passed through a magnetic material to induce magnetization reversal.

In this spin injection-induced magnetization reversing method, a spin injection current serving as a write current is passed through a magnetoresistive element to generate spin-polarized electrons, which are used for magnetization reversal. Specifically, the angular momentum of spin-polarized electrons is transferred to electrons in a magnetic material serving as a magnetic recording layer, and thereby the magnetization of the magnetic recording layer is reversed.

This spin injection-induced magnetization reversing method facilitates locally controlling magnetization states on the nanoscale, and the value of the spin injection current can be decreased in accordance with the finer size of the magnetic material. This facilitates realizing spin electronic devices such as hard disk drives and magnetic random access memories with high recording densities.

For example, the magnetic random access memory includes, as a storage device, a magnetoresistive element having an MTJ (Magnetic Tunnel Junction) film using the Tunneling Magnetoresistive (TMR) effect. The MTJ film includes three layers of thin films including a recording layer and a reference layer made of a magnetic material, and a tunnel barrier layer sandwiched therebetween. The MTJ film stores information using magnetization states of the recording layer and the reference layer. In a spin injection type MRAM using the spin injection-induced magnetization reversing method, information is written to a magnetoresistive element by passing a current in a direction perpendicular to the film surface of the MTJ film.

BRIEF DESCRIPTION OF THE DRAWINGS

FIG. 1 shows a structure of a magnetic memory.
FIGS. 2A to 2K show a manufacturing method of a first embodiment.
FIGS. 3A to 3D show a manufacturing method of a second embodiment.
FIGS. 4A and 4B show a manufacturing method of a third embodiment.
FIGS. 5A to 5D show a manufacturing method of a fourth embodiment.

DETAILED DESCRIPTION

Figure 2D:
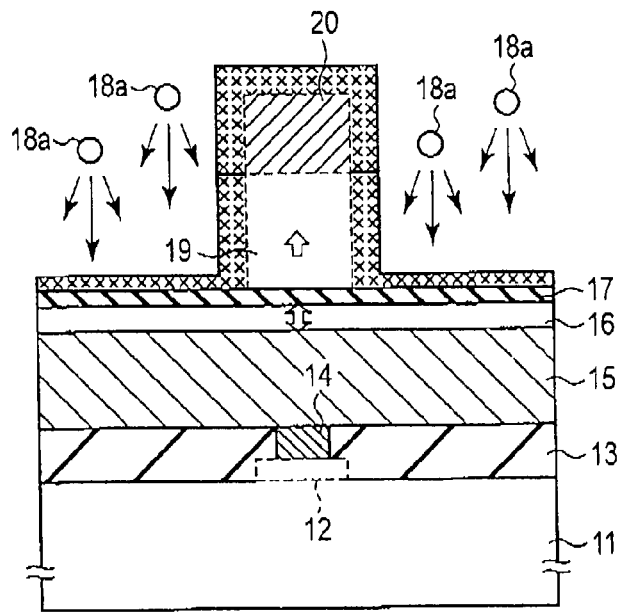

In general, according to one embodiment, a method of manufacturing a magnetic memory, the method comprising: forming a first magnetic layer having a variable magnetization; forming a tunnel barrier layer on the first magnetic layer; forming a second magnetic layer on the tunnel barrier layer, the second magnetic layer having an invariable magnetization; forming a hard mask layer as a mask on the second magnetic layer; patterning the second magnetic layer by using the mask of the hard mask layer; and executing a GCIB-irradiation by using the mask of the hard mask layer, after the patterning.

In the explanation below, elements having the same function and configuration will be denoted with the same reference numerals, and they are explained repeatedly only when necessary.

REFERENCE EXAMPLE

First, a magnetic memory to which a manufacturing method according to an embodiment is applied will be explained.

FIG. 1 illustrates a magnetic memory.

This magnetic memory is, for example, a magnetic random access memory (MRAM). The MRAM includes at least one memory cell. When the MRAM has multiple memory cells, the memory cells are arranged in a matrix form, which constitutes a memory cell array. One memory cell has a magnetoresistive element, and FIG. 1 illustrates the magnetoresistive element.

Device 12 is arranged on semiconductor substrate 11. For example, when one memory cell includes a switch device and a magnetoresistive element, then device 12 is a switch device such as a MOS transistor. Device 12 is covered with interlayer insulating layer 13, and contact plug 14 is electrically connected to device 12.

Underlayer 15 is arranged on contact plug 14. Underlayer 15 may function as a lower electrode of the magnetoresistive element, or a lower electrode may be separately provided in addition to underlayer 15.

Magnetic recording layer (magnetic free layer) 16 is provided on underlayer 15. A magnetization of magnetic recording layer 16 is variable and substantially perpendicular to film surfaces (upper and lower surfaces of magnetic recording layer 16). Tunnel barrier layer 17 is provided on magnetic recording layer 16. For example, underlayer 15 is a layer needed to arrange the magnetization of magnetic recording layer 16 in a direction substantially perpendicular to the film surfaces.

For example, magnetic recording layer 16 includes a structure made by laminating 6 sets of layers including Pd (thickness 0.4 nm) and Co (thickness 0.4 nm), and also includes Ta (thickness 0.3 nm) and CoFeB (thickness 1 nm) on this structure.

For example, tunnel barrier layer 17 has a body-centered cubic lattice (BCC) structure, and is constituted by an MgO layer (thickness 1 nm) oriented in the (001) face.

Magnetic reference layer (pinned layer) 19 is formed on tunnel barrier layer 17. The magnetization of magnetic reference layer 19 is invariable and substantially perpendicular to film surfaces (upper and lower surfaces of magnetic reference layer 19). For example, magnetic reference layer 19 includes CoFeB (thickness 1 nm). Magnetic reference layer 19 may further include Ta (thickness 4 nm), Co (thickness 4 nm), and Pt (thickness 6 nm)/Co (thickness 4 nm).

Hard mask layer 20 is provided on magnetic reference layer 19. For example, hard mask layer 20 includes a Ta layer. Hard mask layer 20 may function as an upper electrode of the magnetoresistive element, or an upper electrode may be separately provided in addition to hard mask layer 20. In this example, a patterning of magnetic reference layer 19 is executed by using a mask of hard mask layer 20, but magnetic recording layer 16 and tunnel barrier layer 17 are not patterned.

In this case, when the magnetizations of magnetic recording layer 16 and magnetic reference layer 19 are substantially perpendicular to the film surfaces, the magnetizations may be perpendicular to the film surfaces or in a range in which the magnetization states (parallel/non-parallel) of magnetic recording layer 16 and magnetic reference layer 19 can be determined (for example, a range θ (45 degrees<θ≤90 degrees (vertical)) with respect to the film surfaces).

Magnetic recording layer 16 includes inactive area (magnetic and electric inactive area) Non that is formed according to a manufacturing method according to an embodiment explained later. A portion actually functioning as a magnetic recording layer in the magnetoresistive element is active area Act (magnetic and electric active area) other than inactive area Non.

The magnetoresistive element is constituted by magnetic recording layer 16, tunnel barrier layer 17, and magnetic reference layer 19. Then, a spin injection current is passed through magnetoresistive element in a direction perpendicular to the film surface, whereby the magnetization of magnetic recording layer 16 is reversed.

Spin-polarized electrons are generated by the spin injection current, and the angular momentum of the spin-polarized electrons is transferred to electrons in magnetic recording layer 16, and thereby the magnetization of magnetic recording layer 16 (direction of spin) is reversed. According to this method, the magnetization of magnetic recording layer 16 is controlled by controlling the direction of the spin injection current.

In contrast, the magnetization of magnetic reference layer 19 is invariable. In this case, invariable magnetization of magnetic reference layer 19 means that, when a magnetization reversal current for reversing the magnetization of magnetic recording layer 16 is passed through magnetic reference layer 19, the magnetization of magnetic reference layer 19 does not change. Therefore, when a magnetic layer whose magnetization reversal current is small is used as magnetic recording layer 16, and a magnetic layer whose magnetization reversal current is large is used as magnetic reference layer 19, then this realizes magnetic recording layer 16 whose magnetization is variable and magnetic reference layer 19 whose magnetization is invariable.

When magnetization reversal is caused by spin-polarized electrons, the magnetization reversal current is proportional to an attenuation constant, an anisotropy field, and the volume of the magnetoresistive element, and therefore, by adjusting them appropriately, the magnetization reversal currents of magnetic recording layer 16 and magnetic reference layer 19 can be set at different values.

It should be noted that an arrow in FIG. 1 represents a magnetization. The magnetization of magnetic reference layer 19 is merely an example. It may be in a downward direction instead of an upward direction.

Each of magnetic recording layer 16 and magnetic reference layer 19 has a magnetic anisotropy substantially perpendicular to the film surfaces, and therefore, an easy-magnetization axis direction thereof is substantially perpendicular to the film surfaces (hereinafter referred to as vertical magnetization). In other words, the magnetoresistive element is a so-called vertical magnetization-type magnetoresistive element, in which each of the magnetizations of magnetic recording layer 16 and magnetic reference layer 19 is substantially perpendicular to the film surfaces.

It should be noted that, when a ferromagnetic body of a certain macro size is assumed, the easy-magnetization axis direction is a direction having the lowest internal energy when the spontaneous magnetization is in that direction without any external magnetic field given. On the other hand, when a ferromagnetic body of a certain macro size is assumed, a hard-magnetization axis direction is a direction having the highest internal energy when the spontaneous magnetization is in that direction without any external magnetic field given.

When magnetic reference layer 19 includes multiple layers, insulating layers 21, 22 are provided to cover its side surfaces without any space formed between insulating layers 21, 22 and side surfaces of the respective layers. Inter-layer insulating layer 23 is for example, silicon oxide ($SiO_2$) or silicon nitride (SiN). The upper surface of inter-layer insulating layer 23 is planarized, and the upper surface of hard mask layer 20 is exposed from inter-layer insulating layer 23.

Then, conductive line (for example, bit line) 24 is connected to electrode layer 20. Conductive line 24 is, for example, aluminum (Al) or copper (Cu).

In the above magnetic memory, underlayer 15 can be constituted by, for example, a thick metal layer serving as a lower electrode and a buffer layer for causing the magnetization of magnetic recording layer 16 to be substantially perpendicular to the film surfaces. Underlayer 15 may have a laminated structure made by laminating metal layers such as tantalum (Ta), copper (Cu), Ru (Ru), and iridium (Ir).

Magnetic recording layer 16 and magnetic reference layer 19 may be made of, for example, an artificial lattice and the like made of a laminated structure including (1) a ferromagnetic material having an $L1_0$ structure or $L1_1$ structure such as FePd, FePt, CoPd, and CoPt, (2) a ferrimagnetic material such as TbCoFe, (3) a magnetic material such as NiFe, Co and a nonmagnetic material such as Cu, Pd, Pt.

Tunnel barrier layer 17 may be made of, for example, magnesium oxide (MgO), Mg nitride, aluminum oxide ($Al_2O_3$), Al nitride, or a laminated structure thereof.

Hard mask layer 20 may be made of a metal such as tantalum (Ta) and tungsten (W) or a conductive compound such as nitrided Ti (TiN), nitride TiSi (TiSiN), and tantalum nitride Si (TaSiN).

It should be noted that each of the magnetizations of magnetic recording layer 16 and magnetic reference layer 19 may be substantially parallel to the film surfaces.

In this case, when the magnetizations of magnetic recording layer 16 and magnetic reference layer 19 are substantially parallel to the film surfaces, the magnetizations may be parallel to the film surfaces or in a range in which the magnetization states (parallel/non-parallel) of magnetic recording layer 16 and magnetic reference layer 19 can be determined (for example, a range θ (0 degrees (parallel)≤θ<45 degrees) with respect to the film surfaces).

In this case, each of magnetic recording layer 16 and magnetic reference layer 19 has a magnetic anisotropy substantially parallel to the film surfaces, and therefore, the easy-magnetization axis directions thereof are substantially parallel to the film surfaces (hereinafter referred to as in-plane magnetization). In other words, the magnetoresistive element is a so-called in-plane magnetization-type magnetoresistive element, in which each of the magnetizations of magnetic recording layer 16 and magnetic reference layer 19 is substantially parallel to the film surfaces.

Examples of magnetic recording layer 16 and magnetic reference layer 19 achieving in-plane magnetization include magnetic metals including at least one element selected from the group consisting of Iron (Fe), cobalt (Co), nickel (Ni), manganese (Mn), and chromium (Cr).

It should be noted that whether the vertical magnetization-type or the in-plane magnetization-type is employed as the magnetoresistive element may be determined in accordance with the characteristics needed for the MRAM.

The above magnetic memory employs the spin injection magnetization reversal method, in which a spin injection current serving as a write current is passed through the magnetoresistive element, and magnetization reversal is executed using spin-polarized electrons generated therein.

In this case, a leaked magnetic field from the magnetic reference layer exerting an influence on the magnetic recording layer usually causes the magnetization of the magnetic recording layer to be in a direction parallel to the magnetization of the magnetic reference layer. However, when the magnetic recording layer is larger than the magnetic reference layer, the leaked magnetic field from the magnetic reference layer exerts a nonuniform influence on the magnetic recording layer, and there is a problem in that this deteriorates the magnetization reversal characteristics with the spin injection. Therefore, the size of the magnetic recording layer is preferably the same as the size of the magnetic reference layer or smaller than the size of the magnetic reference layer.

When the magnetoresistive element employs the spin injection magnetization reversal method, and more particularly, when the magnetoresistive element uses a vertical magnetization film, the magnetic characteristics can be improved by forming the magnetoresistive element with the magnetic recording layer being arranged at a lower side (substrate side).

However, in general, it is difficult to perform dry etching on materials including magnetic metals such as Co and Fe used for the magnetoresistive element, and it is difficult to make it advantageous for increasing the integration density by making the side wall angle in an almost vertical shape. In other words, the side wall angle of the magnetoresistive element formed by ordinary dry etching is not steep, and the size of the magnetic recording layer is more than the size of the magnetic reference layer.

As a result, when the magnetoresistive element is formed with the magnetic recording layer at the lower side (substrate side) and the magnetic reference layer at the upper side, the size of the magnetic recording layer is more than the size of the magnetic reference layer, which makes it difficult to sufficiently increase the magnetization reversal characteristics with the spin injection.

The magnetoresistive element has a laminated structure in which the thin tunnel barrier layer is sandwiched by the magnetic recording layer and the magnetic reference layer, and the distance between the magnetic recording layer and the magnetic reference layer is short. Therefore, when these laminated structures are processed to form the magnetoresistive element, and the tunnel barrier layer as well as the magnetic recording layer and the magnetic reference layer including the magnetic metals are patterned, a re-deposited metal may attach to the side surfaces of the laminated structure over the tunnel barrier layer.

In this case, this re-deposited material generates a leak current path, which short-circuits the magnetic recording layer and the magnetic reference layer, and the magnetoresistive element becomes defective. As a result, there is a problem in that the yield of the magnetoresistive element is reduced.

Accordingly, as shown in the structure of FIG. 1, only the magnetic reference layer, i.e., the upper layer, is patterned in the first patterning process of the magnetoresistive element, and for example, the tunnel barrier layer and the magnetic recording layer immediately thereunder are not patterned.

Then, in the magnetic recording layer, only the portion immediately under the magnetic reference layer is made as a magnetic and electric active area (active area), and the other portion is made as a magnetic and electric inactive area (inactive area), so as to the physical shape and the magnetic/electrical shape of the magnetoresistive element are different.

More specifically, using the mask of the hard mask, the magnetic reference layer is processed with an Ar ion beam up to the upper layer of the tunnel barrier layer, and thereafter, using the mask of the hard mask, an N ion beam is irradiated to inject an N ion (single ion) to the magnetic recording layer under the tunnel barrier layer, whereby the inactive area is formed in the magnetic recording layer.

Thereafter, the memory cell is separated by the second patterning process of the magnetoresistive element, and in this etching, the inactive areas of the magnetic recording layer and the magnetic reference layer are etched. Therefore, even when re-deposited metal materials attach to the side surfaces of the magnetic recording layer/the tunnel barrier layer/the magnetic reference layer, this does not cause any problem.

With the above process, the active area of the magnetic recording layer is formed in a size smaller than the physical shape, and the size of the active area of the magnetic recording layer is formed in the same size as the active area of the magnetic reference layer or in a size smaller than that.

It should be noted that this method can be achieved by emitting a directional ion beam such as N and O in a direction perpendicular to the film surfaces.

However, the magnetoresistive element is constituted by a multilayer film. In particular, a magnetic film having vertical magnetic anisotropy uses a combination of elements whose atomic numbers are greatly different. For example, in Co/Pt, Co/Pd, a light element is Co, and heavy elements are Pt and Pd.

In this case, when the single ions (in the above example, N ions) are injected into the magnetic recording layer, the single ions are scattered in the interfaces of the multilayer film. A single ion scattered at the interface of a heavy element (for example, Pt) is recoiled in a light element (for example, Co), and as a result, many single ions are condensed in the light element layer.

As a result, concentrations of single ions injected into the magnetic recording layer become different (high concentration in the light element layer and low concentration in the heavy element layer), which gives influence to the active area adjacent to the inactive area. That is, this creates a difference in the widths of electric conduction paths in the magnetic recording layer caused by the electric conduction path (in a direction perpendicular to the film surfaces) in each layer constituting the active area within the multilayer magnetic recording layer.

This causes variation in a current density of the spin injection current flowing through the magnetoresistive element, which reduces the margin of the current density needed for reversing the spin injection magnetization. Therefore, this causes a deterioration of spin injection magnetization reversal characteristics, and further, a reduction of the yield of the magnetoresistive element.

In the following embodiments, a technique will be suggested for the magnetic memory having the above structure, wherein when an ion beam is irradiated to form the inactive area in the magnetic recording layer, GCIB (gas cluster ion beam) irradiation is used, so as to prevent a difference in the widths of electric conduction paths in the magnetic recording layer. That is, according to the following manufacturing method, variation in the current density of the spin injection current flowing through the magnetoresistive element can be reduced. Therefore, this increases the margin of the current density needed for reversing the spin injection magnetization, thus improving the spin injection magnetization reversal characteristics and further improving the yield of the magnetoresistive element.

[Basic Configuration]

In a method of manufacturing a magnetic memory according to an embodiment, first, a first magnetic layer having a variable magnetization is formed, a tunnel barrier layer is formed on the first magnetic layer, a second magnetic layer having an invariable magnetization is formed on the tunnel barrier layer, and a hard mask layer is formed on the second magnetic layer. Thereafter, using the mask of the hard mask layer, a patterning of the second magnetic layer is executed, and thereafter, using the mask of the hard mask layer, a GCIB-irradiation is executed, so that a magnetic and electric inactive area is formed at least in the first magnetic layer.

Further, a size of a magnetic and electric active area in the first magnetic layer can be set at a size smaller than that in the second magnetic layer by the GCIB-irradiation. A magnetization of the first and second magnetic layers is preferably, substantially perpendicular to a film surface.

Further, the GCIB-irradiation may have a first irradiation and a second irradiation performed after the first irradiation. In this case, conditions of the first and second irradiations are different from each other. For example, the energy per atom in the first irradiation is smaller than that in the second irradiation. Clusters used in the second irradiation include one of inactive atoms including neon (Ne), argon (Ar), krypton (Kr), xenon (Xe).

After the patterning of the second magnetic layer and before the GCIB-irradiation, a nonmagnetic layer may be formed on the second magnetic layer in an area which is etched by the patterning. The nonmagnetic layer is preferably formed by the GCIB-irradiation.

In a method of manufacturing a magnetic memory according to an embodiment, first, a first magnetic layer having a variable magnetization is formed, a tunnel barrier layer is formed on the first magnetic layer, a second magnetic layer having an invariable magnetization is formed on the tunnel barrier layer, and a hard mask layer is formed on the second magnetic layer. Thereafter, using the mask of a hard mask layer, a patterning of the second magnetic layer, the tunnel barrier layer, and the first magnetic layer is executed. After the patterning, using the mask of the hard mask layer, a GCIB-irradiation is executed. Clusters used in the GCIB-irradiation include one of inactive atoms including neon (Ne), argon (Ar), krypton (Kr), and xenon (Xe).

With the above basic configuration, the margin of the current density needed for reversing the spin injection magnetization is increased, thus improving the spin magnetization reversal characteristics and further improving the yield of the magnetoresistive element.

It should be noted that the present embodiment is effective for not only the spin injection magnetization reversal method but also a magnetization reversal method such as domain wall displacement.

[First Embodiment]

FIGS. 2A to 2K show a manufacturing method of a first embodiment.

First, as shown in FIG. 2A, device 12 is formed on semiconductor substrate 11. Device 12 includes a switch device such as a MOS transistor and a conductive line such as an FEOL (Front End Of Line). Further, inter-layer insulating layer 13 is formed on the device 12, and contact plug 14 reaching the device 12 is formed in inter-layer insulating layer 13.

Thereafter, the upper surface of inter-layer insulating layer 13 is planarized by CMP (Chemical Mechanical Polishing) and etch back. For example, inter-layer insulating layer 13 is silicon oxide ($SiO_2$), and for example, contact plug 14 is tungsten (W).

Subsequently, as shown in FIG. 2B, for example, using a sputtering method, underlayer 15, magnetic recording layer (magnetic free layer) 16, tunnel barrier layer 17, magnetic reference layer (magnetic pinned layer) 19, and hard mask layer 20 are successively formed on contact plug 14.

For example, underlayer 15 is a layer needed to arrange the magnetization of magnetic recording layer 16 in a direction perpendicular to the film surface (the upper surface of the underlayer). For example, as shown in FIG. 2, magnetic recording layer 16 includes a structure made by laminating 6 sets of layers including Pd (thickness 0.4 nm) and Co (thickness 0.4 nm), and also includes Ta (thickness 0.3 nm) and CoFeB (thickness 1 nm) on this structure.

For example, tunnel barrier layer 17 has a body-centered cubic lattice (BCC) structure, and is constituted by an MgO layer (thickness 1 nm) oriented in the (001) face.

For example, magnetic reference layer 19 includes CoFeB (thickness 1 nm). Magnetic reference layer 19 may further include Ta (thickness 4 nm), Co (thickness 4 nm), Pt (thickness 6 nm)/Co (thickness 4 nm), and in this case, the magnetic bias of the magnetoresistive element can be adjusted.

For example, hard mask layer 20 includes a tantalum (Ta) layer.

It should be noted that magnetic reference layer 19 may include a bias magnetic layer having a function to cancel a magnetic field leaked therefrom. Likewise, underlayer 15 may have a bias magnetic layer.

Subsequently, as shown in FIG. 2C and FIG. 2D, using well-known lithography and etching techniques, the first patterning process is performed on the magnetoresistive element. The first patterning process is performed on magnetic reference layer 19.

More specifically, as shown in FIG. 2C, using PEP (Photo engraving process), a photoresist layer is formed on hard mask layer 20, and using the mask of this photoresist layer, the patterning process is performed on hard mask layer 20. Thereafter, the photoresist layer is removed.

Subsequently, as shown in FIG. 2D, using a mask of hard mask layer 20, a patterning of magnetic reference layer 19 is executed by anisotropic etching (for example, RIE (Reactive Ion Etching) and ion milling).

In this case, for example, Ar ion beam (single ion) 18a is irradiated to etch magnetic reference layer 19. In FIG. 2D, an X mark represents a damaged layer caused by an etching process using ion milling.

In this case, magnetic reference layer 19 may be etched until tunnel barrier layer 17 is exposed, or magnetic reference layer 19 may be left on tunnel barrier layer 17 in the etched area, so that tunnel barrier layer 17 is not exposed.

In general, tunnel barrier layer 17 is extremely thin, and it is difficult to stop the etching process as soon as tunnel barrier layer 17 is exposed. In view of this problem of a metal re-deposited material caused by overetching, i.e., etching process reaching magnetic recording layer 16, it is desirable to stop the etching of magnetic reference layer 19 in progress (before tunnel barrier layer 17 is exposed).

Figure 2E:
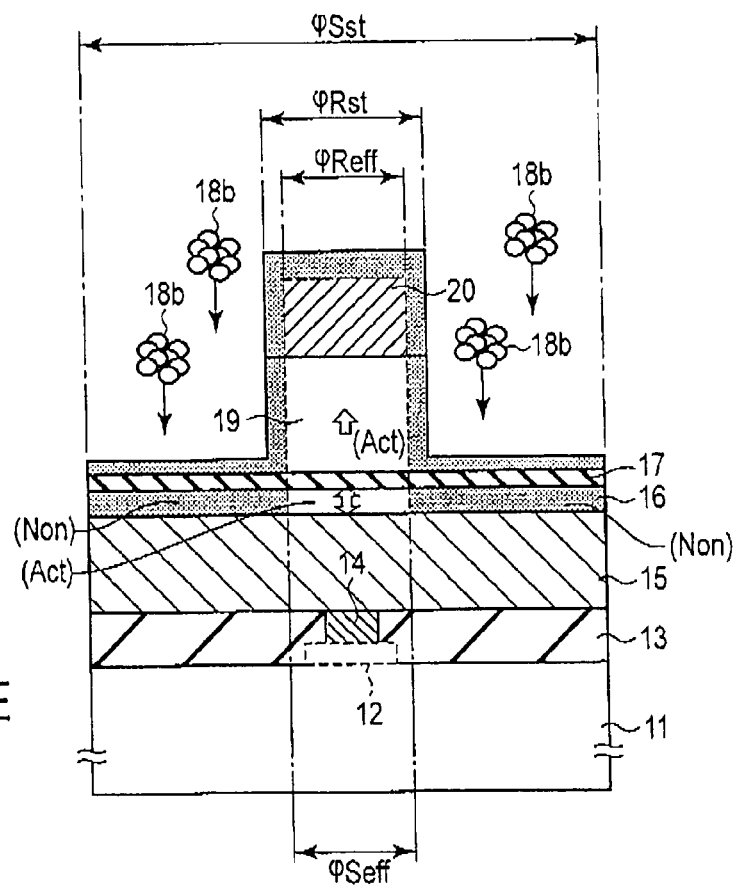

Subsequently, as shown in FIG. 2E, using a mask of hard mask layer 20, GCIB (gas cluster ion beam) irradiation is executed on magnetic recording layer 16 and magnetic reference layer 19.

Cluster 18b used in the GCIB-irradiation has one of $N_2O$, O, N, F, Cl, Ru, Si, B, C, Zr, Tb, Ti, P, and As. Where the total number of clusters used in the GCIB-irradiation is denoted with N, and the average atomic number of a cluster is denoted with A, N×A is desirably more than $1 \times 10^{17}$ cm$^{-2}$.

In this example, the cluster used in the GCIB-irradiation is an N cluster, and this is ion-beam-irradiated at an acceleration voltage of, for example, 5 kV. The total number of N clusters N is, for example, $1 \times 10^{14}$ cm$^{-2}$, and the average atomic number A of clusters is, for example, 2000. For example, N×A is $2 \times 10^{17}$ cm$^{-2}$. At this occasion, the average energy per atom is 2.5 eV.

As a result of this GCIB-irradiation, a portion of magnetic recording layer 16 and magnetic reference layer 19 is made into nonmagnetic and high resistance, and the portion becomes a magnetic and electric inactive area (inactive area) Non. Inactive area Non is formed in an area that is not covered with hard mask layer 20, but some portion of the inactive area may be formed in the area that is covered with hard mask layer 20.

Further, clusters including oxygen are irradiated at the same time or successively, so that the electrical conductivity in the irradiated portion can be reliably reduced, which can prevent reduction in the write/read efficiency caused by a current leak. When the inactive portion of magnetic reference layer 19 is removed by the GCIB-irradiation, the current leak can be reliably prevented, and the write/read efficiency can be increased.

Further, thereafter, using an etching means such as GCIB or monomer ion beam, a high-resistance area (Non) can be physically removed. At this occasion, re-attached layers formed on the side walls of tunnel barrier layer 17 have high resistances, and therefore, tunnel barrier leak is prevented, and the write/read efficiency can be increased.

In the example of FIG. 2E, the magnetic/electrical shape (size) φSeff of magnetic recording layer 16 is less than the physical shape (size) φSst of magnetic recording layer 16, and the magnetic/electrical shape (size) φReff of magnetic reference layer 19 is less than the physical shape (size) φRst of magnetic reference layer 19. Further, physical shape (size) φSst of magnetic recording layer 16 is different from the physical shape (size) φRst of magnetic reference layer 19, but the magnetic/electrical shape (size) φSeff of magnetic recording layer 16 is the same as the magnetic/electrical shape (size) φReff of magnetic reference layer 19.

In the example of FIG. 2F, the magnetic/electrical shape (size) φSeff of magnetic recording layer 16 is less than the magnetic/electrical shape (size) φReff of magnetic reference layer 19. The relationships other than the above are the same as those of FIG. 2E.

Further, in the example of FIG. 2G, the magnetic/electrical shape (size) φSeff of magnetic recording layer 16 is more than the magnetic/electrical shape (size) φReff of magnetic reference layer 19. The relationships other than the above are the same as those of FIG. 2E.

It should be noted that the range of inactive area Non, i.e., magnetic/electrical shape (size) φSeff of magnetic recording layer 16, can be controlled according to the structure of the multilayer film constituting magnetic recording layer 16 and magnetic reference layer 19 and conditions of GCIB-irradiation (the type of cluster, N×A value, and the like).

Figure 2H:
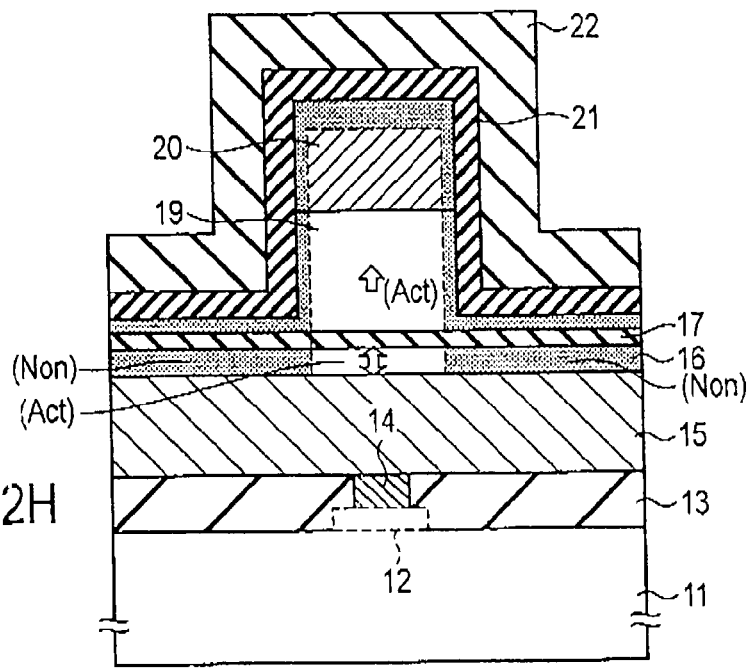

Subsequently, as shown in FIG. 2H, insulating layers 21, 22 covering magnetic reference layer 19 and hard mask layer 20 are formed. When magnetic reference layer 19 includes multiple layers, insulating layers 21, 22 attach to its side surfaces without any space formed between insulating layers 21, 22 and side surfaces of the respective layers.

Figure 2I:
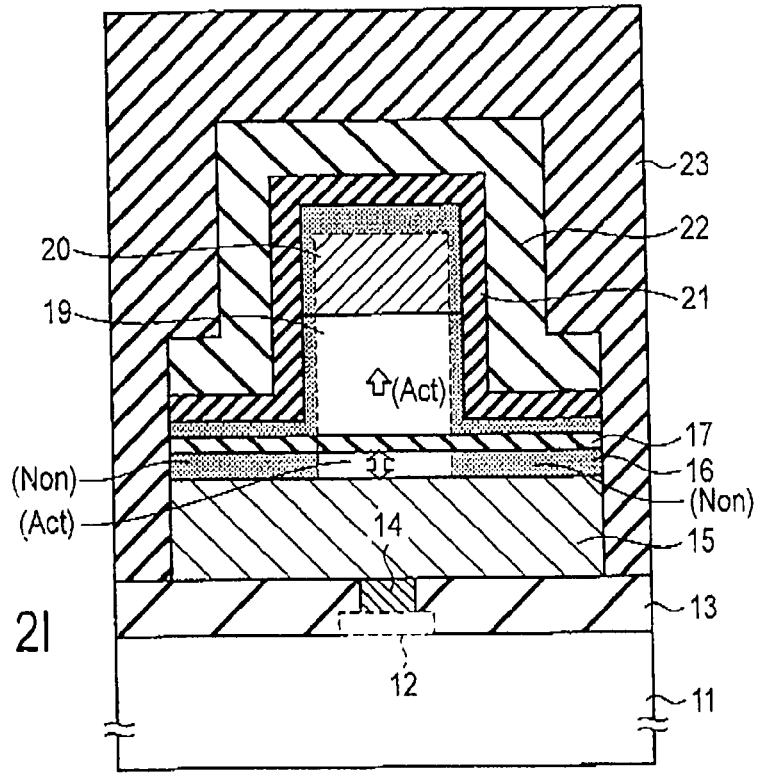

Subsequently, as shown in FIG. 2I, using well-known lithography and etching techniques, the second patterning process is performed on the magnetoresistive element. The second patterning process is performed on magnetic recording layer 16, tunnel barrier layer 17, and magnetic reference layer 19.

That is, a photoresist layer is formed on insulating layer 22, and thereafter, using a mask of the photoresist layer, insulating layers 21, 22, magnetic reference layer 19, tunnel barrier layer 17, magnetic recording layer 16, and underlayer 15 are etched by RIE, so that an independent magnetoresistive element MTJ is formed.

In this case, the patterning process of the magnetoresistive element at this stage is performed on inactive area Non of magnetic recording layer 16 and magnetic reference layer 19, and therefore, even if metal re-deposited material attaches to side walls of magnetic recording layer 16/tunnel barrier layer 17/magnetic reference layer 19, this does not cause any problem.

Thereafter, inter-layer insulating layer 23 covering magnetoresistive element MTJ is formed. Inter-layer insulating layer 23 is for example, silicon oxide ($SiO_2$) or silicon nitride (SiN). Thereafter, the upper surface of inter-layer insulating layer 23 is planarized using a CMP method.

Subsequently, as shown in FIG. 2J, using the CMP method, the upper surface of inter-layer insulating layer 23 is continuously ground, so that the upper surface of hard mask layer 20 is exposed.

Finally, as shown in FIG. 2K, conductive line 24 connected to hard mask layer 20 is formed on inter-layer insulating layer 23. Conductive line 24 is, for example, aluminum (Al) or copper (Cu).

When a magnetoresistive element of a magnetic random access memory (MRAM) was made according to the above manufacturing method, the margin of the current density needed for reversing the spin injection magnetization can be increased, thus improving the spin injection magnetization reversal characteristics and further improving the yield of the magnetoresistive element.

[Second Embodiment]

The second embodiment is a modification of the first embodiment. The second embodiment is different from the first embodiment in that, in the first patterning process of the first embodiment, the bottom surface of the etched area (a portion of the upper surface portion of the magnetic reference layer that is not covered with the hard mask layer) is made into a tapered shape.

First, the same steps as those of the first embodiment are executed until magnetic recording layer 16, tunnel barrier layer 17, and magnetic reference layer 19 are formed and patterned hard mask layer 20 is formed on magnetic reference layer 19 (see FIG. 2A to FIG. 2C).

Figure 3A:
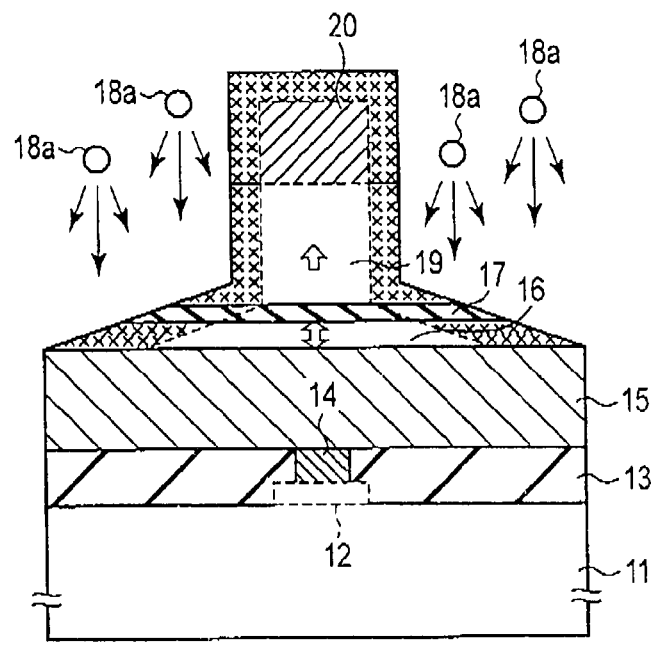

Subsequently, as shown in FIG. 3A, using a mask of hard mask layer 20, a patterning of magnetic reference layer 19 is executed by anisotropic etching (for example, RIE (Reactive Ion Etching) and ion milling).

In this case, for example, Ar ion beam (single ion) 18a is irradiated to etch magnetic reference layer 19. In FIG. 3A, an X mark represents a damaged layer caused by an etching process using ion milling. As a result of this ion milling, the bottom surface of the etched area is processed into a tapered shape.

Figure 3B:
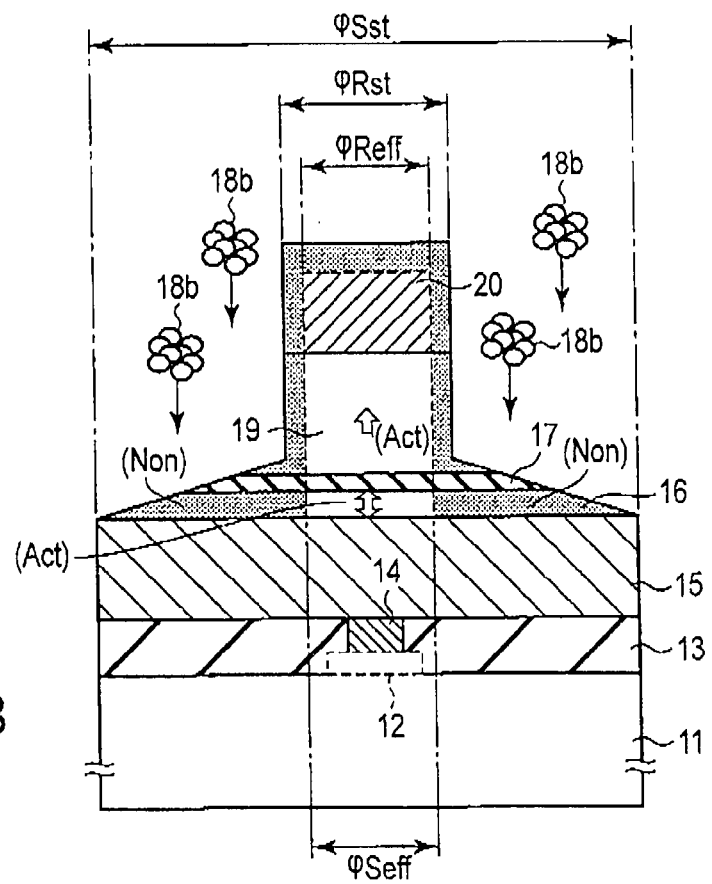

Subsequently, as shown in FIG. 3B, using a mask of hard mask layer 20, GCIB-irradiation is executed on magnetic recording layer 16 and magnetic reference layer 19.

Cluster 18b used in the GCIB-irradiation has one of $N_2O$, O, N, F, Cl, Ru, Si, B, C, Zr, Tb, Ti, P, As. Where the total number of clusters used in the GCIB-irradiation is denoted with N, and the average atomic number of cluster is denoted with A, N×A is desirably more than $1 \times 10^{17}$ cm$^{-2}$.

In this example, the cluster used in the GCIB-irradiation is an $N_2O$ cluster. In this case, the energy per atom K of clusters is desirably 1 eV or more. For example, where the total number of $N_2O$ clusters N is $5 \times 10^{14}$ cm$^{-2}$, the average atomic number A of $N_2O$ clusters is 2000, and ion beam irradiation is performed with an acceleration voltage (cluster energy) of 30 keV, then the energy per atom K is 15 eV.

Further, N×A is the amount of ion injection (the dose amount), and the value of N×A is $1 \times 10^{18}$ cm$^{-2}$. The energy density D is $1.5 \times 10^{19}$ [eV/cm$^2$] (=K×N×A=15 eV×$1 \times 10^{18}$ cm$^{-2}$).

Accordingly, a portion of magnetic recording layer 16 and magnetic reference layer 19 can be made into nonmagnetic and high resistance. It should be noted that inactivation of magnetic recording layer 16 and magnetic reference layer 19 may occur under a condition where N×A is larger than $1 \times 10^{17}$ cm$^{-2}$ as explained above.

Further, like the first embodiment, clusters including oxygen are irradiated at the same time or successively, so that the electrical conductivity in the irradiated portion can be reliably reduced, which can prevent reduction in the write/read efficiency caused by a current leak. When the inactive portion of magnetic reference layer 19 is removed by the GCIB-irradiation, the current leak can be reliably prevented, and the write/read efficiency can be increased.

Further, thereafter, using etching means such as GCIB or monomer ion beam, a high-resistance area (Non) can be physically removed. At this occasion, re-attached layers formed on the side walls of tunnel barrier layer 17 have high resistances, and therefore, tunnel barrier leak is prevented, and the write/read efficiency can be increased.

As a result of this GCIB-irradiation, a portion of magnetic recording layer 16 and magnetic reference layer 19 is inactivated, and the portion becomes a magnetic and electric inactive area (inactive area) Non. Inactive area Non is formed in an area that is not covered with hard mask layer 20, but some portion of the inactive area may be formed in the area that is covered with hard mask layer 20.

In the example of FIG. 3B, the magnetic/electrical shape (size) ϕSeff of magnetic recording layer 16 is less than the physical shape (size) ϕSst of magnetic recording layer 16, and the magnetic/electrical shape (size) ϕReff of magnetic reference layer 19 is less than the physical shape (size) ϕRst of magnetic reference layer 19. Further, the physical shape (size) ϕSst of magnetic recording layer 16 is different from the physical shape (size) ϕRst of magnetic reference layer 19, but the magnetic/electrical shape (size) ϕSeff of magnetic recording layer 16 is the same as the magnetic/electrical shape (size) ϕReff of magnetic reference layer 19.

In the example of FIG. 3C, the magnetic/electrical shape (size) ϕSeff of magnetic recording layer 16 is less than the magnetic/electrical shape (size) ϕReff of magnetic reference layer 19. The relationships other than the above are the same as those of FIG. 3B.

Further, in the example of FIG. 3D, the magnetic/electrical shape (size) ϕSeff of magnetic recording layer 16 is more than the magnetic/electrical shape (size) ϕReff of magnetic reference layer 19. The relationships other than the above are the same as those of FIG. 3B.

The steps after this are performed in the same manner as those of the first embodiment, and the magnetic random access memory (MRAM) is formed (see FIG. 2H to FIG. 2K).

When a magnetoresistive element of a magnetic random access memory (MRAM) was made according to the above manufacturing method, the margin of the current density needed for reversing the spin injection magnetization can be increased, thus improving the spin injection magnetization reversal characteristics and further improving the yield of the magnetoresistive element, like the first embodiment.

It should be noted that, in this example, use of $N_2O$ cluster has been explained, but the same effects can be obtained even when other clusters are used. For example, even when an N cluster, O cluster, and the like are used, the GCIB-irradiation can be executed under the same condition (for example, energy per atom K is set at a value equal to or more than 1 eV).

[Third Embodiment]

The third embodiment is a modification of the first embodiment. The third embodiment is different from the first embodiment in that, in the first patterning process of the first embodiment, the side surfaces of the hard mask layer and the magnetic reference layer are made into a tapered shape.

First, the same steps as those of the first embodiment are executed until magnetic recording layer 16, tunnel barrier layer 17, and magnetic reference layer 19 are formed and patterned hard mask layer 20 is formed on magnetic reference layer 19 (see FIG. 2A to FIG. 2C).

Subsequently, as shown in FIG. 4A, using a mask of hard mask layer 20, a patterning of magnetic reference layer 19 is executed by anisotropic etching (for example, RIE (Reactive Ion Etching) and ion milling).

In this case, for example, an Ar ion beam (single ion) is irradiated to etch magnetic reference layer 19. As a result of this ion milling, the side surfaces of hard mask layer 20 and magnetic reference layer 19 are processed into a tapered shape.

Thereafter, using a mask of hard mask layer 20, the GCIB-irradiation is executed on magnetic recording layer 16 and magnetic reference layer 19.

Cluster 18b used in the GCIB-irradiation has one of $N_2O$, O, N, F, Cl, Ru, Si, B, C, Zr, Tb, Ti, P, and As. Where the total number of clusters used in the GCIB-irradiation is denoted with N, and the average atomic number of cluster is denoted with A, N×A is desirably more than $1×10^{17}$ cm$^{-2}$.

Specific examples of conditions of the GCIB-irradiation are the same as for the second embodiment, and explanation thereof is omitted.

As a result of this GCIB-irradiation, as shown in FIG. 4B, a portion of magnetic recording layer 16 and magnetic reference layer 19 is inactivated, and the portion becomes a magnetic and electric inactive area (inactive area) Non. Inactive area Non is formed in an area that is not covered with hard mask layer 20, but some portion of the inactive area may be formed in the area that is covered with hard mask layer 20.

In this example, the magnetic/electrical shape (size) φSeff of magnetic recording layer 16 is less than the physical shape (size) φSst of magnetic recording layer 16, and the magnetic/electrical shape (size) φReff of magnetic reference layer 19 is less than the physical shape (size) φRst of magnetic reference layer 19. Further, the physical shape (size) φSst of magnetic recording layer 16 is different from the physical shape (size) φRst of magnetic reference layer 19, but the magnetic/electrical shape (size) φSeff of magnetic recording layer 16 is less than the magnetic/electrical shape (size) φReff of magnetic reference layer 19.

The steps after this are performed in the same manner as those of the first embodiment, and the magnetic random access memory (MRAM) is formed (see FIG. 2H to FIG. 2K).

When a magnetoresistive element of a magnetic random access memory (MRAM) was made according to the above manufacturing method, the margin of the current density needed for reversing the spin injection magnetization can be increased, thus improving the spin injection magnetization reversal characteristics and further improving the yield of the magnetoresistive element, like the first embodiment.

[Fourth Embodiment]

The fourth embodiment relates to the conditions of the GCIB-irradiation in the first and third embodiments. The fourth embodiment is characterized in that the GCIB-irradiation is realized with multiple ion beam irradiations of different conditions. In this manner, the conditions of the GCIB-irradiation are changed in multiple steps, so that the characteristics of the magnetoresistive element can be further improved.

For example, in the first irradiation, an $N_2O$ cluster is used, the energy per atom K is set at 3.3 eV, the energy density D is set at $1×10^{19}$ [eV/cm$^2$] (the total number of clusters N is set at $1×10^{15}$ cm$^{-2}$, the average atomic number A of clusters is set at 3000, and the acceleration voltage (cluster energy) is set at 10 keV).

In the second irradiation, an $N_2O$ cluster is used, the energy per atom K is set at 0.1 eV, the energy density D is set at $1×10^{18}$ [eV/cm$^2$] (the total number of clusters N is set at $1×10^{15}$ cm$^{-2}$, the average atomic number A of clusters is set at 10000, and the acceleration voltage (cluster energy) is set at 1 keV).

It should be noted that the energy per atom in the second irradiation is less than the energy per atom in the first irradiation.

With the above arrangement, the magnetic recording layer and the magnetic reference layer are inactivated in the first irradiation. In the second irradiation, any distortion and defects formed in the magnetic recording layer and the magnetic reference layer during the first irradiation are alleviated, and further, any unevenness thereof can be planarized.

Distortions and defects formed in the magnetic recording layer and the magnetic reference layer reduce the crystal magnetic anisotropy, and the unevenness thereof brings about a change of the volume of the magnetic layer. Therefore, when distortions, defects, and unevenness of the magnetic recording layer and the magnetic reference layer are alleviated or further eliminated as in the present embodiment, this results in advantages such as a reduction in variation of operation of the magnetoresistive element and improvement of long-term reliability.

It should be noted that, in this example, the ion species used in the second irradiation may be the same as the ion species used in the first irradiation. Alternatively, they may be different from each other. For example, in the second irradiation, it is more preferable to use inert atoms (inert gas) such as Ne cluster, Ar cluster, Kr cluster, and Xe cluster.

In low energy irradiation with an inert gas, the temperature of the irradiation surface can be instantly increased/decreased, and therefore, a defect on a process face can be restored without changing distribution of impurity elements introduced during the first irradiation by thermal diffusion. As a result, this improves the characteristics of the magnetoresistive element.

It should be noted that the second irradiation has an effect of removing re-deposited materials generated during the etching process of the magnetic layer, enabling the side walls of the magnetoresistive element to be formed straight, and contributing to stable operation of the element.

When this effect is used, the patterning of the magnetoresistive element can be completed in only one patterning process. In other words, metal re-deposited materials are considered during the patterning process of the magnetoresistive element in the first to third embodiments. Accordingly, in the first patterning process, only a patterning of the magnetic reference layer is executed, and thereafter, the magnetic and electric inactive area is formed by the GCIB-irradiation. Further, a patterning of the magnetic recording layer, the tunnel barrier layer, and the magnetic reference layer are equally executed in this GCIB-irradiation.

In contrast, as shown in FIG. 5A, using a mask of hard mask layer 20, a patterning of magnetic reference layer 19, tunnel barrier layer 17, and magnetic recording layer 16 is executed by anisotropic etching (for example, RIE (Reactive Ion Etching) and ion milling).

In this example shown here, monomer Ar ion beam 18a is irradiated at 600 V, so that the magnetoresistive element is processed in one etching process. As a result of this etching, for example, as shown in FIG. 5B, metal re-deposited materials 25 attach to the side walls of magnetic reference layer 19, tunnel barrier layer 17, and magnetic recording layer 16.

In this state, an electric conduction path (leak path) PASS is generated extending from underlayer (lower electrode) 15, passing through magnetic recording layer 16, re-deposited materials 25, and magnetic reference layer 19, and reaching hard mask layer (upper electrode) 20, and this electric conduction path PASS exerts an adverse influence on the read/write operation of the magnetoresistive element.

Therefore, as shown in FIG. 5C, the GCIB-irradiation is executed. The conditions of the GCIB-irradiation are the same as those of the above second irradiation.

For example, a Kr cluster is used, the energy per atom K is set at 0.1 eV, the energy density D is set at $1×10^{18}$ [eV/cm$^2$] (the total number of clusters N is set at $1×10^{15}$ cm$^{-2}$, the average atomic number A of clusters is set at 10000, and the acceleration voltage (cluster energy) is set at 1 keV).

Accordingly, the re-deposited materials 25 formed on the side walls of magnetic recording layer 16, tunnel barrier layer 17, and magnetic reference layer 19 are removed by Kr clusters as shown in FIG. 5C, and as a result, as shown in FIG. 5D, the side walls of magnetic recording layer 16, tunnel barrier layer 17, and magnetic reference layer 19 become clean without the re-deposited materials 25.

As described above, the GCIB-irradiation at a low energy using inert atoms (inert gas) such as Ne cluster, Ar cluster, Kr cluster, and Xe cluster prevents a short circuit caused by the re-deposited materials, and this can improve the characteristics of the magnetoresistive element.

At this occasion, several percent of O or N may be mixed.

[Fifth Embodiment]

The fifth embodiment relates to GCIB-irradiation, and relates to a technique for forming a nonmagnetic layer in an inactivated portion of the magnetic recording layer and the magnetic reference layer in advance, performing GCIB-irradiation on the surface of the nonmagnetic layer to cause clusters used in the GCIB-irradiation to collide with the nonmagnetic layer, and further injecting atoms in the nonmagnetic layer into the magnetic recording layer and the magnetic reference layer in a chain collision manner, thus inactivating the magnetic recording layer and the magnetic reference layer.

First, the same steps as those of the first embodiment are executed until magnetic recording layer 16, tunnel barrier layer 17, and magnetic reference layer 19 are formed and patterned hard mask layer 20 is formed on magnetic reference layer 19 (see FIG. 2A to FIG. 2C).

Figure 6A:
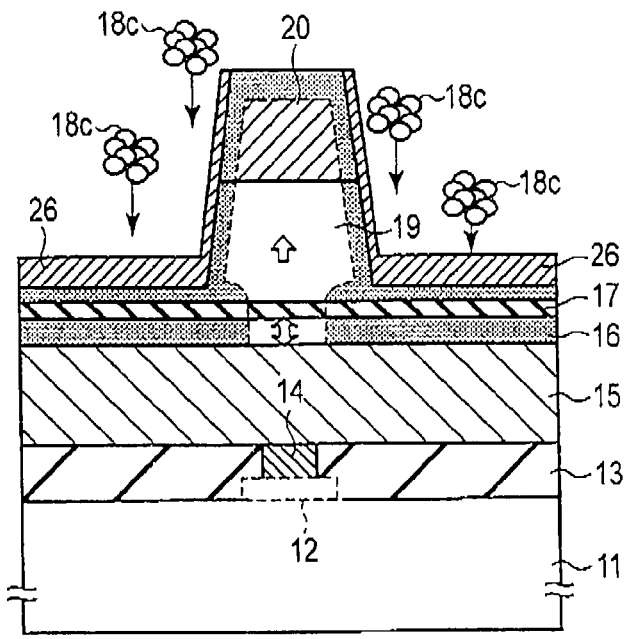
FIGS. 6A and 6B show a manufacturing method of a fifth embodiment.

Subsequently, as shown in FIG. 6A, using a mask of hard mask layer 20, a patterning of magnetic reference layer 19 is executed by anisotropic etching (for example, RIE (Reactive Ion Etching) and ion milling).

In this case, for example, an Ar ion beam (single ion) is irradiated to etch magnetic reference layer 19. As a result of this ion milling, the side surfaces of hard mask layer 20 and magnetic reference layer 19 are processed into a tapered shape.

Thereafter, nonmagnetic layer (for example, Ru layer) 26 having a thickness of 3 to 5 nm is formed on the upper surface and the side surfaces of magnetic reference layer (portion etched in the previous step) 19. Nonmagnetic layer 26 may be formed by the GCIB-irradiation, or may be formed using a sputtering method and vacuum evaporation method.

For example, when GCIB-irradiation is executed with Ru cluster 18c, nonmagnetic layer (Ru layer) 26 is deposited more thickly on the upper surface of magnetic reference layer (portion etched in the previous step) 19 than on the side surfaces of magnetic reference layer 19, which is more preferable for carrying out the present embodiment.

Figure 6B:
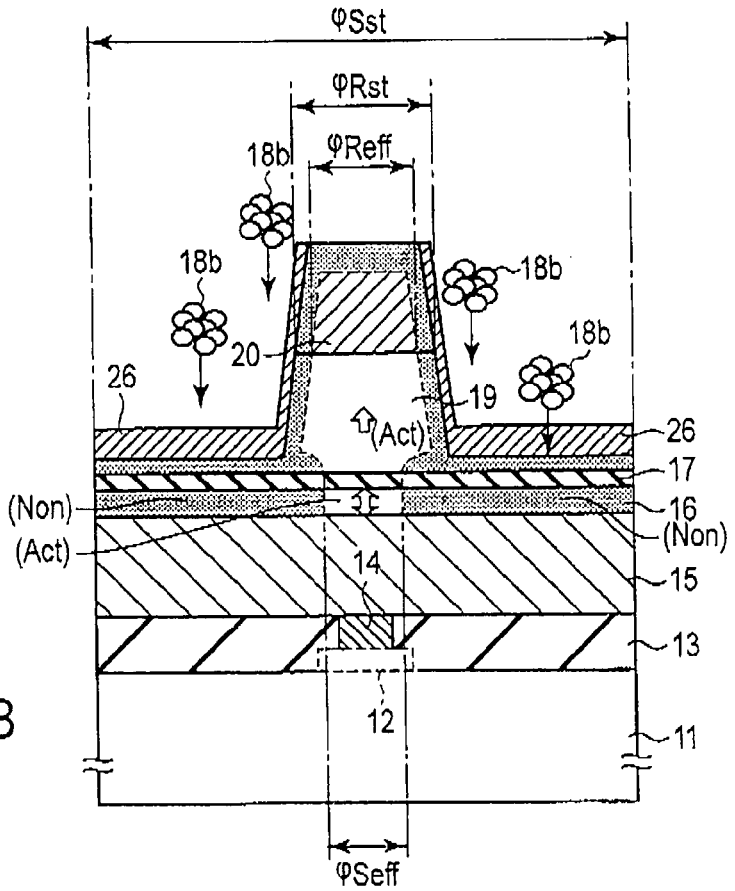

Subsequently, as shown in FIG. 6B, using a mask of hard mask layer 20, GCIB-irradiation is executed on magnetic recording layer 16 and magnetic reference layer 19.

Cluster 18b used in the GCIB-irradiation has one of $N_2O$, O, N, F, Cl, Ru, Si, B, C, Zr, Tb, Ti, F, As. Clusters used in the GCIB-irradiation include one of inactive atoms including neon (Ne), argon (Ar), krypton (Kr), xenon (Xe).

Where the total number of clusters used in the GCIB-irradiation is denoted with N, and the average atomic number of cluster is denoted with A, N×A is desirably more than $1 \times 10^{17}$ cm$^{-2}$.

For example, when an Ar cluster is used, the energy per atom K is set at 3.3 eV, and the energy density D is set at $1 \times 10^{19}$ [eV/cm$^2$] (the total number of clusters N is set at $1 \times 10^{15}$ cm$^{-2}$, the average atomic number A of clusters is set at 3000, and the acceleration voltage (cluster energy) is set at 10 keV). Under the above conditions, inactivation is performed.

At this occasion, in order to remove the nonmagnetic layer attached to the side walls of hard mask layer 20 and magnetic recording layer 19, it is extremely preferable to make the side surfaces of hard mask layer 20 and magnetic recording layer 19 in a tapered shape as in the present embodiment. This tapered shape is preferably inclined about 5 degrees or more with respect to the direction perpendicular to the film surface.

As a result of this GCIB-irradiation, as shown in FIG. 6B, a portion of magnetic recording layer 16 and magnetic reference layer 19 is inactivated, and the portion becomes a magnetic and electric inactive area (inactive area) Non.

The steps after this are performed in the same manner as those of the first embodiment, and the magnetic random access memory (MRAM) is formed (see FIG. 2H to FIG. 2K).

When a magnetoresistive element of a magnetic random access memory (MRAM) was made according to the above manufacturing method, the margin of the current density needed for reversing the spin injection magnetization can be increased, thus improving the spin injection magnetization reversal characteristics and further improving the yield of the magnetoresistive element, like the first embodiment.

It should be noted that nonmagnetic layer 26 according to the present embodiment can be made of not only Ru but also Si, B, C, Zr, Tb, Ti, P, As, Mg, and oxides, nitrides, and fluorides thereof.

[Others]

The mechanism of inactivation (i.e., changing into nonmagnetic and high resistance) of the magnetic recording layer and the magnetic reference layer can be explained using the dose amount of atoms injected into the magnetic layer by the GCIB-irradiation as shown in the above embodiments. On the other hand, the GCIB-irradiation also has an effect of causing diffusion of atoms in a particular layer in the multilayer film. Therefore, the mechanism of inactivation can also be explained using interdiffusion of atoms within the multilayer film caused by the GCIB-irradiation.

For example, atoms constituting the tunnel barrier layer (for example, MgO) are diffused into the magnetic recording layer and the magnetic reference layer by the GCIB-irradiation, whereby the magnetic recording layer and the magnetic reference layer can be inactivated (i.e., changed into nonmagnetic and high resistance).

In this case, clusters used in the GCIB-irradiation are not limited to $N_2O$, O, N, F, Cl, Ru, Si, B, C, Zr, Tb, Ti, P, $A_s$. For example, the magnetic recording layer and the magnetic reference layer can be inactivated (i.e., changed into nonmagnetic and high resistance) by GCIB-irradiation using argon (Ar) clusters, krypton (Kr) clusters, and the like.

[Conclusion]

According to the manufacturing method of the embodiments, the margin of the current density needed for reversing the spin injection magnetization can be increased. According to the manufacturing method of the embodiments, the spin injection magnetization reversal characteristics of the magnetoresistive element used in the memory cell can be improved, and further the magnetoresistive elements can be manufactured at a high yield. Therefore, for example, this can contribute to the improvement of the productivity of the MRAM. Regarding the magnetization reversal method of the magnetoresistive element, the present embodiment can be applied not only to the spin injection magnetization reversal method but also to the domain wall displacement method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetic memory, the method comprising:
    forming a first magnetic layer having a variable magnetization;
    forming a tunnel barrier layer on the first magnetic layer;
    forming a second magnetic layer on the tunnel barrier layer, the second magnetic layer having an invariable magnetization;
    forming a hard mask layer as a mask on the second magnetic layer;
    patterning at least one part of the second magnetic layer in a patterning area which is not covered with the hard mask so as to leave all or one part of the first magnetic layer in the patterning area, by an etching using the mask; and
    changing the first magnetic layer in the patterning area to a magnetically and electrically inactive area by executing a GCIB-irradiation using the mask, after the patterning.

2. The method of claim 1,
    wherein a size of a magnetically and electrically active area in the first magnetic layer is smaller than that in the second magnetic layer by the GCIB-irradiation.

3. The method of claim 1,
    wherein a magnetization direction of the first and second magnetic layers is perpendicular to a film surface.

4. The method of claim 1,
    wherein clusters using the GCIB-irradiation comprise one of the group of $N_2O$, O, N, F, Cl, Ru, Si, B, C, Zr, Tb, Ti, P and As.

5. The method of claim 1,
    wherein $N \times A > 1 \times 10^{17}$ cm$^{-2}$,
    where N is a total number of clusters using the GCIB-irradiation, and A is an average atomic number of clusters.

6. The method of claim 1,
    wherein an upper portion of the second magnetic layer in an area not covered by the hard mask layer has a taper shape by the patterning.

7. The method of claim 1,
    wherein a side wall portion of each of the hard mask layer and the second magnetic layer has a taper shape.

8. The method of claim 1,
    wherein the GCIB-irradiation comprises a first irradiation and a second irradiation after the first irradiation, and conditions of the first and second irradiations is different from each other.

9. The method of claim 8,
    wherein an energy per atom of clusters using the first irradiation is larger than that of clusters using the second irradiation.

10. The method of claim 8,
    wherein clusters using the first irradiation comprise one of $N_2O$, O, N, F, Cl, Ru, Si, B, C, Zr, Tb, Ti, P and As, and clusters using the second irradiation comprise inactive atoms.

11. The method of claim 10,
    wherein the inactive atoms includes one of Ar, Kr and Xe.

12. The method of claim 10,
    wherein the inactive atoms includes Ne.

13. The method of claim 1, wherein
    the executing GCIB-irradiation comprises:
    forming a high-resistance area in at least the first magnetic layer, and
    etching the high-resistance area after the forming the high-resistance area,
    wherein the etching the high-resistance area is executed by changing conditions of the forming the high-resistance area.

14. The method of claim 1, further comprising
    forming a nonmagnetic layer on the second magnetic layer in an area which is etched by the patterning, after the patterning.

15. The method of claim 1, wherein
    the executing GCIB-irradiation comprises:
    forming a nonmagnetic layer on the second magnetic layer in an area which is etched by the patterning, and
    forming a high-resistance area in at least the first magnetic layer after the forming the nonmagnetic layer.

16. The method of claim 14,
    wherein the nonmagnetic layer comprises a material selected from a group of Ru, Si, B, C, Zr, Tb, Ti, P, As and Mg, or an oxide, a nitride or a fluoride of the material.

17. The method of claim 1,
    wherein the tunnel barrier layer and the first magnetic layer are not etched by the patterning.

18. The method of claim 1,
    wherein the tunnel barrier layer and the first magnetic layer are etched in part by the patterning.

19. The method of claim 18,
    wherein an upper portion of the tunnel barrier layer and the first magnetic layer in an area not covered by the hard mask layer has a taper shape by the patterning.

20. A method of manufacturing a magnetic memory, the method comprising:
    forming a first magnetic layer having a variable magnetization;
    forming a tunnel barrier layer on the first magnetic layer;
    forming a second magnetic layer on the tunnel barrier layer, the second magnetic layer having an invariable magnetization;
    forming a hard mask layer as a mask on the second magnetic layer;
    patterning the second magnetic layer, the tunnel barrier layer and the first magnetic layer by using the mask of the hard mask layer; and
    executing a GCIB-irradiation by using the mask of the hard mask layer, after the patterning,
    wherein clusters using the GCIB-irradiation comprise inactive atoms.

21. The method of claim 20,
    wherein the inactive atoms includes one of Ar, Kr and Xe.

22. The method of claim 20,
    wherein the inactive atoms includes Ne.

23. The method of claim 20,
    wherein a size of a magnetic and electric active area in the first magnetic layer is smaller than that in the second magnetic layer by the GCIB-irradiation.

24. The method of claim 20,
    wherein a magnetization direction of the first and second magnetic layers is perpendicular to a film surface.

25. The method of claim 20,
    wherein a gas of the clusters includes one of O and N.

26. The method of claim 1, wherein
    the executing GCIB-irradiation comprises forming a high-resistance area in at least the first magnetic layer, and the high-resistance area is etched by a monomer ion beam after the GCIB-irradiation.

* * * * *